United States Patent
Pisek et al.

(10) Patent No.: US 7,752,525 B2
(45) Date of Patent: Jul. 6, 2010

(54) EFFICIENT PARALLEL CYCLIC REDUNDANCY CHECK CALCULATION USING A NOVEL TABLE LOOKUP APPROACH

(75) Inventors: Eran Pisek, Plano, TX (US); Jasmin Oz, Plano, TX (US)

(73) Assignee: Samsung Electronics Co., Ltd., Suwon-si (KR)

(*) Notice: Subject to any disclaimer, the term of this patent is extended or adjusted under 35 U.S.C. 154(b) by 993 days.

(21) Appl. No.: 11/504,159

(22) Filed: Aug. 15, 2006

(65) Prior Publication Data

US 2008/0065959 A1    Mar. 13, 2008

(51) Int. Cl.
*H03M 13/00*    (2006.01)
(52) U.S. Cl. .................. 714/758; 714/807; 714/781; 702/189
(58) Field of Classification Search ............... 714/758, 714/807, 781; 702/189
See application file for complete search history.

(56) References Cited

U.S. PATENT DOCUMENTS 6,836,869 B1 * 12/2004 Wyland ................ 714/781
7,266,760 B1 *  9/2007 Bain ..................... 714/807

* cited by examiner

*Primary Examiner*—Guy J Lamarre

(57) ABSTRACT

A system for cyclic redundancy check (CRC) calculations with modulo-2 multiplication is disclosed for repetitive CRC computations that optimizes processing efficiency and maximizes capacity. The resulting system results in the use of relatively fewer logical gates and conserves on power. The system receives a message ($\vec{m}$) including a plurality of blocks ($\vec{b}_i$) and a set of pre-computed coefficients ($\vec{\beta}_i$). The system performs a modulo-2 multiply-accumulate operation on the message ($\vec{m}$) using the relationship given by:

$$CRC(\vec{m}) \equiv CRC\left(\sum_i \vec{b}_i \otimes \vec{\beta}_i\right).$$

22 Claims, 2 Drawing Sheets

EFFICIENT PARALLEL CYCLIC REDUNDANCY CHECK CALCULATION USING A NOVEL TABLE LOOKUP APPROACH

TECHNICAL FIELD OF THE INVENTION

The present invention relates generally to data processing systems and, more specifically, to systems and methods for optimizing the efficiency and capacity of cyclic redundancy check operations.

BACKGROUND OF THE INVENTION

In current systems, parallel cyclic redundancy check (CRC) computations involve decomposing an N-bit message into small blocks. Each block has a fixed size (M). The fixed size typically equals the polynomial degree. Most approaches include computing the CRC of a message and performing a series of N/M Galois multiply-accumulate operations. Each of the N/M blocks is multiplied by a pre-stored coefficient, divided by the CRC polynomial, and added to the accumulator. Accordingly, these systems require N/M Galois parallel multiply-accumulate operations.

There are a number of disadvantages to such approaches. For example, Galois multipliers typically require the use of special hardware with a considerable number of logical gates. Conventional Galois multiplier architectures consume large areas of silicon. Moreover, Galois operations are rarely used in common applications. Furthermore, the CRC ploynomial is typically hardwired into an efficient Galois multiplier. Such a design is not reconfigurable to support other polynomials.

There is therefore a need for a system and method that includes modulo-2 multiplications for repetitive operations in CRC computations that optimize processing efficiency and maximize capacity.

SUMMARY OF THE INVENTION

Embodiments of the present disclosure include a cyclic redundancy check (CRC) system with modulo-2 multiplications for repetitive CRC computations that optimize processing efficiency and maximize capacity.

In one embodiment, a method for cyclic redundancy checks (CRC) is disclosed. The method includes receiving a message ($\vec{m}$). The message includes a plurality of blocks ($\vec{b}_i$) and a set of pre-computed coefficients ($\vec{\beta}_i$). The method also includes performing a modulo-2 multiply-accumulate operation on the message ($\vec{m}$), wherein the operation is given by:

$$CRC(\vec{m}) \equiv CRC\left(\sum_i \vec{b}_i \otimes \vec{\beta}_i\right).$$

In another embodiment, a system for cyclic redundancy checks (CRC) is disclosed. The system includes a controller capable of receiving a message ($\vec{m}$). The message includes a plurality of blocks ($\vec{b}_i$) and a set of pre-computed coefficients ($\vec{\beta}_i$). The controller is also capable of performing a modulo-2 multiply-accumulate operation on the message ($\vec{m}$). The operation is given by:

$$CRC(\vec{m}) \equiv CRC\left(\sum_i \vec{b}_i \otimes \vec{\beta}_i\right).$$

In still another embodiment, a process for cyclic redundancy checks (CRC) for use in a signal processing system is disclosed. The process includes receiving a message ($\vec{m}$). The message includes a plurality of blocks ($\vec{b}_i$) and a set of pre-computed coefficients ($\vec{\beta}_i$). The process also includes performing modulo-2 multiply-accumulate operations on the message ($\vec{m}$).

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the terms "element", "construct" or "component" may mean any device, system or part thereof that performs a processing, control or communication operation; and such a device may be implemented in hardware, firmware or software, or some combination of at least two of the same. It should be noted that the functionality associated with any particular construct or component may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
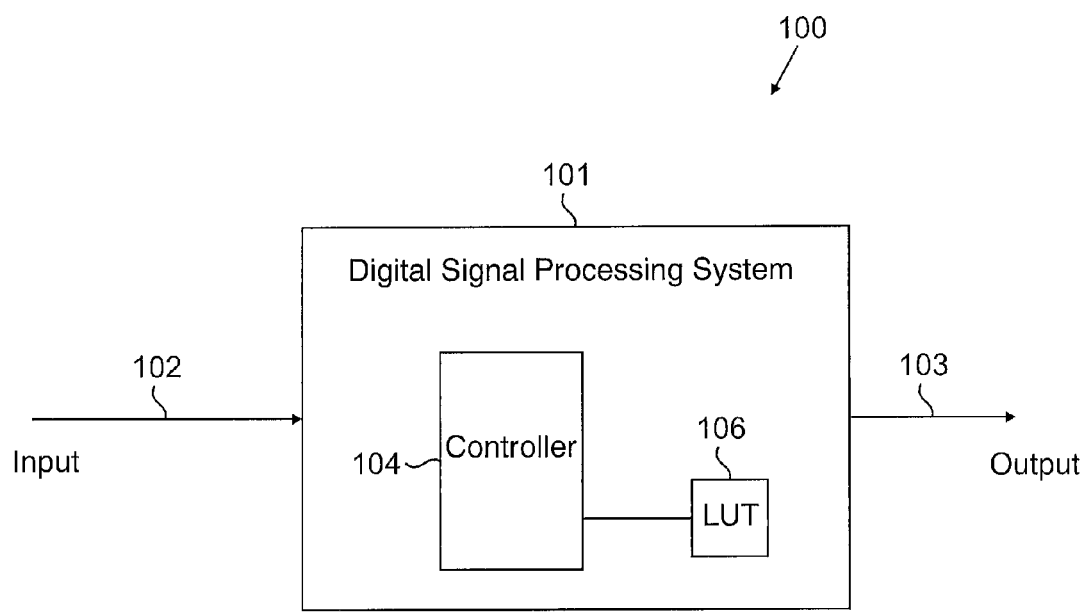
FIG. 1 illustrates a simplified block diagram of an exemplary digital signal processing system and controller for cyclic redundancy check calculations according to one embodiment of the present disclosure.
Figure 2:
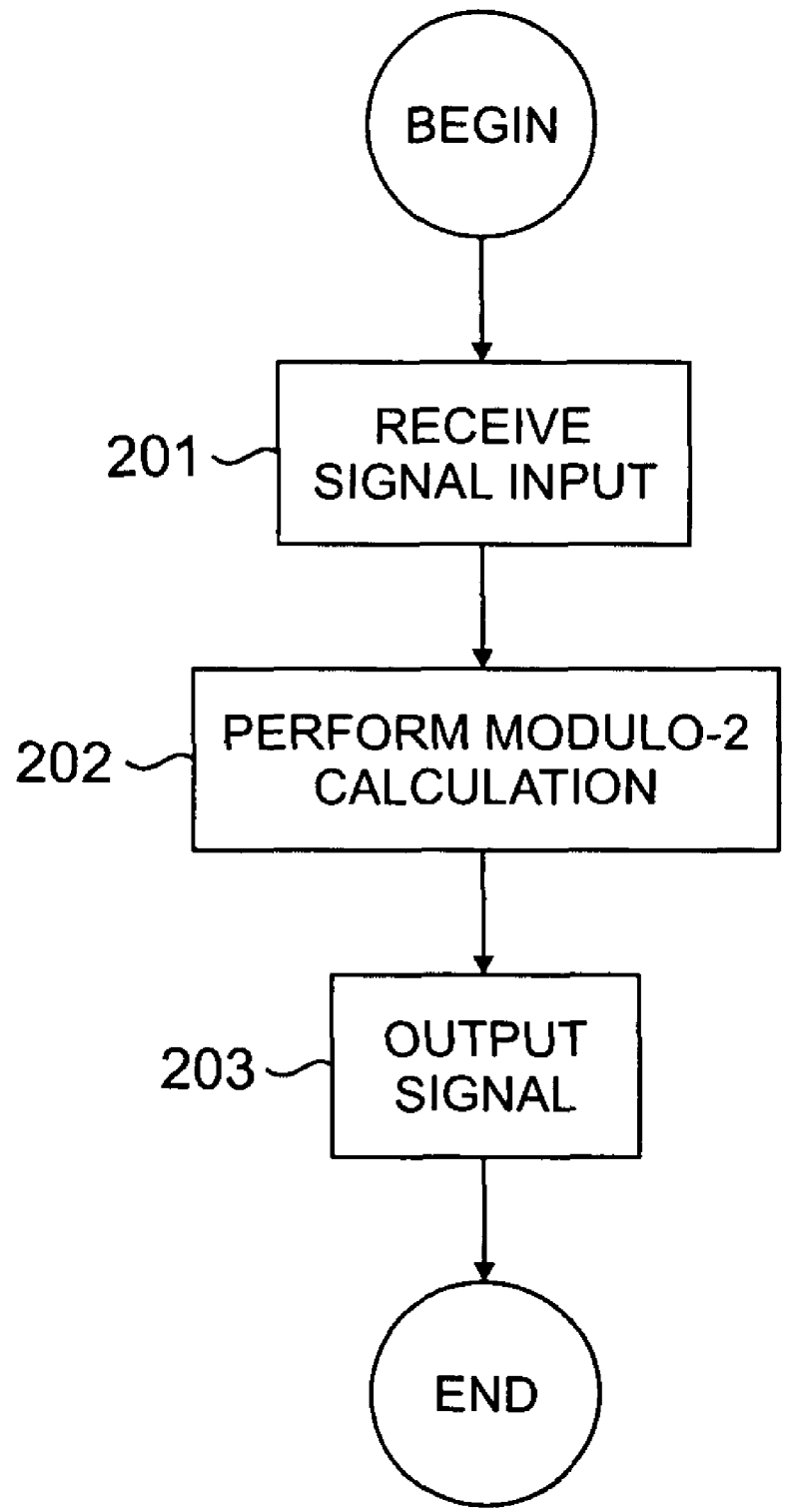
FIG. 2 is a simplified flowchart illustrating a method in accordance with one embodiment of the present disclosure.

FIGS. 1 and 2, discussed below, and the various embodiments used to describe the principles of the present disclosure in this patent document are by way of illustration only, and should not be construed in any way to limit the scope of the disclosure. Hereinafter, certain aspects of the present disclosure are described in relation to illustrative embodiments and operations of wireless communications systems and networks. Those skilled in the art, however, will understand that the principles and teachings of the present disclosure may be implemented in a variety of suitably arranged signal processing systems utilized in any number of end-equipment applications.

Typical Galois multiply-accumulate systems include a message ($\vec{m}$) consisting of N bits. The message is a superposition of a plurality of blocks ($\vec{b}_i$). Each block ($\vec{b}_i$) is of a fixed size (e.g., M bits). The blocks are multiplied over a Galois Field of prime two (e.g., GF(2)) with unit vectors ($\vec{e}_i$) shifted by M bits with respect to each other. Thus, the message ($\vec{m}$) can be decomposed as shown by Equation 1 below:

$$\vec{m} = \sum_{i=0}^{N/M-1} \vec{b}_i \otimes \vec{e}_i \quad \text{[Eqn. 1]}$$

The summation and the multiplication operations included in Equation 1 are performed over GF(2). The GF(2) multiplication is shown as the symbol "$\otimes$", while the GF(2) addition operation (an XOR operation) is shown as the symbol "$\oplus$".

As an example of a typical application for Galois multiply-accumulate system, suppose a message ($\vec{m}$) containing sixteen bits (N=16) requires decomposition and is equal to the binary sequence [1101111100111010]. Suppose further that message ($\vec{m}$) is a superposition of blocks ($\vec{b}_i$) of a fixed number of bits (M). For example, suppose M=4 and is equal to the polynomial degree (or CRC width) W=3. Finally, suppose that the CRC polynomial ($\vec{p}$) is equal to [1010].

In a typical Galois application, message ($\vec{m}$) is first divided into four blocks [$\vec{b}_3$ $\vec{b}_2$ $\vec{b}_1$ $\vec{b}_0$] of four bits each, where $\vec{b}_0$=1010, $\vec{b}_1$=0011, $\vec{b}_2$=1111 and $\vec{b}_3$=1101. Moreover, message ($\vec{m}$) is the superposition of the blocks ($\vec{b}_i$) multiplied by unit vectors ($\vec{e}_i$) as given in Equation 2 below:

$$\vec{m} = \vec{b}_0 \otimes \vec{e}_0 \oplus \vec{b}_1 \otimes \vec{e}_1 \oplus \vec{b}_2 \otimes \vec{e}_2 \oplus \vec{b}_3 \otimes \vec{e}_3. \quad \text{[Eqn. 2]}$$

Continuing with the example above, suppose that the unit vectors ($\vec{e}_i$) are given by $\vec{e}_0$=1, $\vec{e}_1$=10000, $\vec{e}_2$=100000000 and $\vec{e}_3$=1000000000000. Next, the CRC of the message ($\vec{m}$) is given by the modulo-2 division of message ($\vec{m}$) by the CRC polynomial ($\vec{p}$) as given in Equation 3 below:

$$CRC(\vec{m}) \equiv CRC\left(\sum_i \vec{b}_i \otimes \vec{e}_i\right) = \sum_i CRC(\vec{b}_i \otimes (\vec{e}_i)). \quad \text{[Eqn. 3]}$$

Using the modulation properties of Equations 4 and 5 below and after assuming that x is smaller than p (i.e., mod $(x)_p$=x), Equation 3 may be simplified to Equation 6 below, where $\vec{\beta}_i \equiv CRC(\vec{e}_i)$ and $\vec{\beta}_i$ is a set of pre-computed coefficients:

$$\text{mod}(x \oplus y)_p = \text{mod}(x)_p \oplus \text{mod}(y)_p; \quad \text{[Eqn. 4]}$$

$$\text{mod}(x \otimes y)_p = \text{mod}(\text{mod}(x)_p \otimes \text{mod}(y)_p)_p; \quad \text{[Eqn. 5]}$$

-continued $$CRC(\vec{m}) \equiv \sum_i CRC(\vec{b}_i \otimes \vec{\beta}_i). \quad \text{[Eqn. 6]}$$

Finally, Equation 6 simplifies to Equation 7 below, where the CRC calculation essentially becomes a series of Galois multiply-accumulate operations:

$$CRC(\vec{m}) \equiv \sum_i gmpy(\vec{b}_i, \vec{\beta}_i). \quad \text{[Eqn. 7]}$$

In Equation 7, the blocks ($\vec{b}_i$) are of a particular size (e.g., W bits or less).

FIG. 1 a simplified block diagram of a system 100 for cyclic redundancy check calculations with modulo-2 multiplication in accordance with one embodiment of the present disclosure. System 100 includes a digital signal processing system 101 having an input 102 and an output 103. By way of example, system 100 may include wire line or wireless communication devices (including cell phones, PCS handsets, personal digital assistant (PDA) handsets, portable computers, telemetry devices, etc.), computer systems, audio and video equipment, satellite communications, multimedia applications, home automation systems and any other systems requiring digital signal processing. Digital signal processing system 101 includes a controller 104 for performing cyclic redundancy check calculations according to one embodiment of the present disclosure. Digital signal processing system 101 may optionally include a lookup table (LUT) 106. It should be understood that embodiments of the present disclosure may implemented into existing equipment, such as multipliers.

In accordance with one embodiment of the present disclosure, however, a series of modulo-2 multiply-accumulate operations is preferable. In alternate embodiments, modulo-2 multiplications may be used for at least some of the repetitive operations performed in the cyclic redundancy check (CRC) computations. As explained in greater detail below, a series of N-bit messages is parsed into blocks of size M for N/M parallel modulo-2 and multiply-accumulate operations. Finally, the accumulator is divided by the polynomial ($\vec{p}$).

As a specific example, Equation 3 above may be expanded using Equation 8 to arrive at Equation 9 below.

$$\text{mod}(x \otimes y)_p = \text{mod}(\text{mod}(x)_p \otimes \text{mod}(y)_p)_p \quad \text{[Eqn. 8]}$$

$$CRC(\vec{m}) = \sum_i CRC(\vec{b}_i \otimes (\vec{e}_i)) \quad \text{[Eqn. 9]}$$

$$= CRC\left(\sum_i CRC(\vec{b}_i) \otimes \vec{\beta}_i\right)$$

Assuming that the block sizes ($\vec{b}_i$) are of size W bits or less, Equation 9 may be further simplified to a series of modulo-2 multiply-accumulate operations, as shown in Equation 10:

$$CRC(\vec{m}) \equiv CRC\left(\sum_i \vec{b}_i \otimes \vec{\beta}_i\right) \quad \text{[Eqn. 10]}$$

The division operation by the CRC polynomial is an epilog operation. Therefore, processing speed becomes less essential and reconfigurability becomes the main consideration.

FIG. 2 is a simplified flowchart illustrating method 200. Method 200 provides a method for cyclic redundancy check (CRC) operations in accordance with one embodiment of the present disclosure. Method 200 begins with receiving a message ($\vec{m}$) from, for example, input 102 of system 100 in step 201. The message includes a plurality of blocks ($\vec{b}_i$) and a set of pre-computed coefficients ($\vec{\beta}_i$.) In step 202, controller 104 performs a modulo-2 multiply-accumulate operation on the message ($\vec{m}$) using the relationship given by Equation 10 above. Method 200 finally ends with step 203 by outputting a signal from digital signal processing system 101.

Embodiments of the present disclosure offer a number of advantages over previously known systems and methods. For example, the present disclosure is based on modulo-2 multiplications and therefore uses relatively few logical gates and consumes less power when compared to prior art Galois multiplication techniques. Moreover, because the modulo-2 multiplication is not followed by a division, the operation may be performed at higher clock speed than the prior art systems based on Galois multiplications.

Conventional Galois multiplication methods depend upon the polynomials involved in the operation. As noted above, Galois multipliers have hardwired CRC polynomials and therefore are not reconfigurable to support other polynomials. Embodiments of the modulo-2 multiplication operation in accordance with the present disclosure, however, do not depend on a specific polynomial. Moreover, a lookup table approach may be implemented for full reconfigurability during polynomial division using, for example, lookup table 106. Thus, the polynomial value may be customized to suit a particular application.

Previous systems and methods require N/W CRC operations. According to one embodiment of the present disclosure, however, a series of GF(2) multiplications requires only one final CRC operation. Thus, one embodiment of the present disclosure saves at least (N/W)-1 unnecessary divisions.

Existing systems may be modified by turning off the carry bit capability and using the modulo-2 multiplication in accordance with the present disclosure. As another example, in one embodiment according to the present disclosure, the system and method may include performing the division of the accumulator by the CRC polynomial by a nibble using lookup table 106. Lookup table 106 is preferably made up of 16×W bits.

Although certain aspects of the present disclosure have been described in relation to specific systems, standards and structures, it should be easily appreciated by one skilled in the art that embodiments of the system of the present disclosure provides and comprehends a wide array of variations and combinations easily adapted to a number of signal processing systems. As described herein, the relative arrangement and operation of necessary functions may be provided in any manner suitable for a particular application. All such variations and modifications are hereby comprehended. It should also be appreciated that the constituent members or components of this system may be produced or provided using any suitable hardware, firmware, software, or combination(s) thereof.

The embodiments and examples set forth herein are therefore presented to best explain the present disclosure and its practical application, and to thereby enable those skilled in the art to make and utilize the system of the present disclosure. The description as set forth herein is therefore not intended to be exhaustive or to limit any invention to a precise form disclosed. As stated throughout, many modifications and variations are possible in light of the above teaching without departing from the spirit and scope of the following claims.

What is claimed is:

1. A method for cyclic redundancy checks (CRC) by a digital signal processing system, comprising:

receiving a message ($\vec{m}$) at an input of a digital signal processing system, wherein the message comprises a plurality of blocks ($\vec{b}_i$) and a set of pre-computed coefficients ($\vec{\beta}_i$); and performing a modulo-2 multiply-accumulate operation on the message ($\vec{m}$) by a controller of the digital signal processing system, wherein the operation is given by:

$$CRC(\vec{m}) \equiv CRC\left(\sum_i \vec{b}_i \otimes \vec{\beta}_i\right),$$

wherein the modulo-2 multiply-accumulate operation is not followed by a division operation to complete the CRC.

2. The method of claim 1, wherein the coefficients ($\vec{\beta}_i$) are a function of a unit vector ($\vec{e}_i$).

3. The method of claim 2, wherein the coefficients ($\vec{\beta}_i$) are given by:

$\vec{\beta}_i = CRC(\vec{e}_i)$.

4. The method of claim 1, wherein the blocks ($\vec{b}_i$) are of a fixed number of bits (W).

5. The method of claim 4 further comprising:
reconfiguring a CRC polynomial using a lookup table.

6. The method of claim 5, wherein the lookup table is made of 16×W bits.

7. The method of claim 5, wherein reconfiguring the CRC polynomial is accomplished by loading a new lookup table.

8. A system for cyclic redundancy checks (CRC), comprising:

a controller capable of:

receiving a message ($\vec{m}$), wherein the message comprises a plurality of blocks ($\vec{b}_i$) and a set of pre-computed coefficients ($\vec{\beta}_i$); and performing a modulo-2 multiply-accumulate operation on the message ($\vec{m}$), wherein the operation is given by:

$$CRC(\vec{m}) \equiv CRC\left(\sum_i \vec{b}_i \otimes \vec{\beta}_i\right),$$

wherein the modulo-2 multiply-accumulate operation is not followed by a division operation to complete the CRC.

9. The system of claim 8, wherein the coefficients ($\vec{\beta}_i$) are a function of a unit vector ($\vec{e}_i$).

10. The system of claim 9, wherein the coefficients ($\vec{\beta}_i$) are given by:

$$\vec{\beta}_i = CRC(\vec{e}_i).$$

11. The system of claim 8, wherein the blocks ($\vec{b}_i$) are of a fixed number of bits (W).

12. The system of claim 11 further comprising:
a lookup table to aid in reconfiguring a CRC polynomial.

13. The system of claim 12, wherein the lookup table is made of 16×W bits.

14. The system of claim 12, wherein the reconfiguring of the CRC polynomial is accomplished by loading a new lookup table.

15. For use in a signal processing system, a process for cyclic redundancy checks (CRC), comprising:
receiving a message ($\vec{m}$) at an input of the signal processing system, wherein the message comprises a plurality of blocks ($\vec{b}_i$) and a set of pre-computed coefficients ($\vec{\beta}_i$); and
performing modulo-2 multiply-accumulate operations on the message ($\vec{m}$) by a controller of the signal processing system, wherein the modulo-2 multiply-accumulate operation is not followed by a division operation to complete the CRC.

16. The process of claim 15, wherein the operations are given by:

$$CRC(\vec{m}) \equiv CRC\left(\sum_i \vec{b}_i \otimes \vec{\beta}_i\right).$$

17. The process of claim 15, wherein the coefficients ($\vec{\beta}_i$) are a function of a unit vector ($\vec{e}_i$).

18. The process of claim 17, wherein the coefficients ($\vec{\beta}_i$) are given by:

$$\vec{\beta}_i = CRC(\vec{e}_i).$$

19. The process of claim 15, wherein the blocks ($\vec{b}_i$) are of a fixed number of bits (W).

20. The process of claim 19 further comprising:
reconfiguring a CRC polynomial using a lookup table.

21. The process of claim 20, wherein the lookup table is made of 16×W bits.

22. The process of claim 20, wherein reconfiguring the CRC polynomial is accomplished by loading a new lookup table.

* * * * *